(12) United States Patent
Furuya et al.

(10) Patent No.: US 9,905,997 B2
(45) Date of Patent: Feb. 27, 2018

(54) IMAGE DISPLAY DEVICE

(71) Applicant: Panasonic Intellectual Property Management Co., Ltd., Osaka (JP)

(72) Inventors: Hiroyuki Furuya, Osaka (JP); Takahisa Shiramizu, Saga (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/381,941

(22) Filed: Dec. 16, 2016

(65) Prior Publication Data
US 2017/0201068 A1  Jul. 13, 2017

(30) Foreign Application Priority Data

Jan. 12, 2016 (JP) .................. 2016-003582

(51) Int. Cl.
*H01S 5/068* (2006.01)
*H01S 5/40* (2006.01)
(Continued)

(52) U.S. Cl.
CPC ...... *H01S 5/06804* (2013.01); *G02B 26/0833* (2013.01); *G02B 27/01* (2013.01);
(Continued)

(58) Field of Classification Search
CPC .............. G02B 27/01; G02B 27/0101; G02B 26/0833; G02B 2027/0112; G02B 2027/014; G02B 27/0103; G02B 27/017; G02B 5/32; G02B 26/02; G02B 27/0172; H04N 9/3161; H04N 9/3194; H04N 9/3155; H04N 9/3164; H01S 5/4093; H01S 5/06804; G03B 21/206; G03B 21/142; G03B 21/2033; G06T 19/006
See application file for complete search history.

(56) References Cited

U.S. PATENT DOCUMENTS 8,902,130 B2 * 12/2014 Furuya ..................... G02B 5/32
345/7
8,934,159 B2 * 1/2015 Shikii ..................... G02B 27/01
359/3
(Continued)

FOREIGN PATENT DOCUMENTS

JP 2013-015738 1/2013
JP 2013-226746 11/2013
(Continued)

*Primary Examiner* — Vibol Tan
(74) *Attorney, Agent, or Firm* — McDermott Will & Emery LLP

(57) ABSTRACT

An image display device includes a laser light source, a controller, a temperature acquisition unit, and an image forming unit. The laser light source emits a plurality of laser beams including a red laser beam, a green laser beam, and a blue laser beam. The controller controls lighting of the laser light source. The temperature acquisition unit obtains temperature information with respect to the laser light source. The image forming unit creates an image from the plurality of laser beams emitted from the laser light source. The controller varies a light output ratio between the plurality of laser beams, based on the temperature information obtained by the temperature acquisition unit.

16 Claims, 13 Drawing Sheets

(51) Int. Cl.
*G02B 26/08* (2006.01)
*G02B 27/01* (2006.01)

(52) U.S. Cl.
CPC ........ *G02B 27/0101* (2013.01); *H01S 5/4093* (2013.01); *G02B 2027/0112* (2013.01)

(56) References Cited

U.S. PATENT DOCUMENTS

| | | | |
|---|---|---|---|
| 9,081,184 B2* | 7/2015 | Yamakawa | B60K 35/00 |
| 9,134,536 B2* | 9/2015 | Sekiya | G02B 27/01 |
| 9,243,761 B2* | 1/2016 | Nakanishi | G03B 21/2033 |
| 2007/0279755 A1* | 12/2007 | Hitschmann | G02B 27/0101 |
| | | | 359/630 |
| 2008/0192045 A1* | 8/2008 | Brandt | G02B 27/0103 |
| | | | 345/419 |
| 2012/0099170 A1* | 4/2012 | Shikii | G02B 27/01 |
| | | | 359/3 |
| 2013/0287418 A1 | 10/2013 | Akagi | |
| 2014/0152711 A1 | 6/2014 | Sekiya et al. | |
| 2014/0285536 A1 | 9/2014 | Haruna et al. | |
| 2014/0293235 A1* | 10/2014 | Azuma | G03B 21/147 |
| | | | 353/31 |
| 2014/0293432 A1* | 10/2014 | Takemoto | G02B 27/0101 |
| | | | 359/630 |
| 2015/0022568 A1 | 1/2015 | Ishii et al. | |
| 2015/0260984 A1* | 9/2015 | Yamakawa | H04N 9/3129 |
| | | | 345/591 |
| 2016/0073071 A1* | 3/2016 | Nagashima | G09G 3/002 |
| | | | 353/121 |
| 2016/0330418 A1* | 11/2016 | Nakai | H04N 9/3135 |
| 2017/0160544 A1* | 6/2017 | Takemoto | G02B 27/0101 |

FOREIGN PATENT DOCUMENTS

| | | |
|---|---|---|
| JP | 2014-186078 | 10/2014 |
| JP | 2015-022096 | 2/2015 |
| JP | 2015-064539 | 4/2015 |

\* cited by examiner

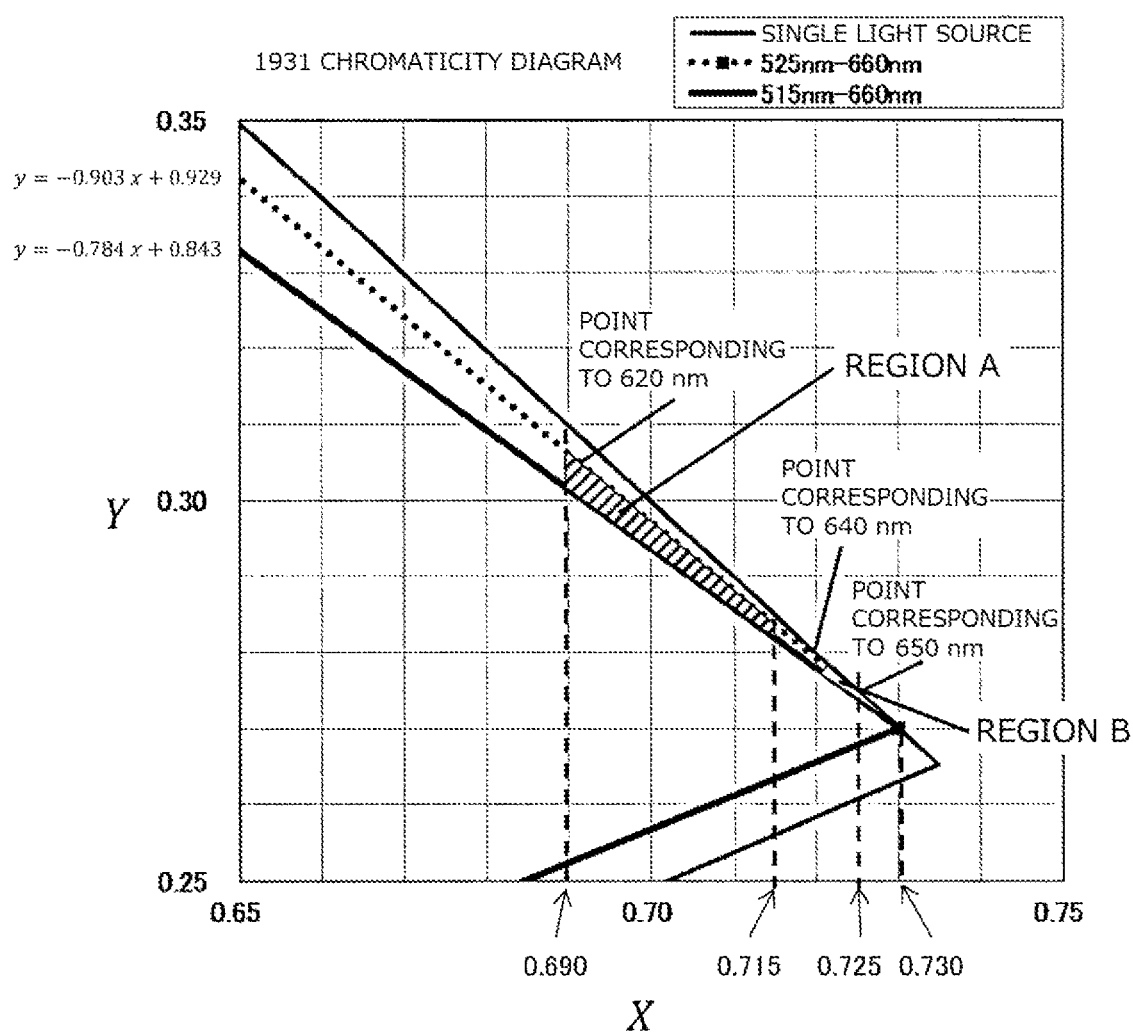

BLI:BLUE LD LIGHTING INSTRUCTION
GLI:GREEN LD LIGHTING INSTRUCTION
RLI:RED LD LIGHTING INSTRUCTION
HMS:HORIZONTAL MONITOR SIGNAL
VMS:VERTICAL MONITOR SIGNAL
HDS:HORIZONTAL DRIVE SIGNAL
VDS:VERTICAL DRIVE SIGNAL

IMAGE DISPLAY DEVICE

BACKGROUND

1. Technical Field

The present disclosure relates to an image display device, and more specifically to an image display device suitably applicable to, for example a configuration that projects an image formed by an image forming unit onto a screen with laser light from a light source, thereby displaying the image.

2. Description of the Related Art

In recent years, image display devices equipped with a virtual image optical system have been increasingly developed. The virtual image optical system displays image in space by using a reflective glass surface (or a half mirror), a free-form surface mirror, and other optical components in combination.

The above virtual image optical system is expected to be applied especially to image display devices, called head-up displays, to be mounted in passenger vehicles or other movable bodies. An exemplary head-up display to be mounted in a passenger vehicle modulates light based on image information and irradiates the windshield with the modulated light. Then, the modulated light is reflected by the windshield and incident on the driver's eyes. In this way, the driver can view a virtual image based on the image information in front of the windshield. For example, the virtual image displayed in this manner may contain a vehicle speed or an ambient temperature. Studies are currently being conducted to display, as virtual images, a navigation image and an image for calling driver's attention to passersby, for example.

Some head-up displays, as described above, are equipped with a laser light source including a semiconductor laser, as their light source. This configuration scans a screen with laser light modulated with an image signal. Then, the laser light is diffused over the screen so that the light is incident on the driver's eyes from a wider area. This prevents the driver's eyes from leaving the irradiated area even if he or she moves the head to some degree. Consequently, the driver can view the image (virtual image) appropriately and stably.

By using a laser as a light source, an optical system that scans the screen with a laser beam can be downsized. Furthermore, by combining a virtual image optical system having a high optical magnification with a laser light source, a smaller optical system can display a larger virtual image. These configurations are expected to enable head-up displays to be installed in many different types of vehicles.

However, when a laser, especially a semiconductor laser is used in an image display device as its light source, the output of the light source relative to its input power (electric-optic conversion efficiency) may decrease at certain temperatures. More specifically, if the image display device displays a white image, this white image might be darkened at certain temperatures. Likewise, if the image display device displays a single-colored image, such as a red, green, or blue image, this image might be darkened at certain temperatures.

Moreover, the image display device may fail to clearly exhibit gradations of colors at low luminance at certain temperatures, because a light-emitting property of a laser light source is fluctuated at or near its oscillation threshold.

Many engineers have considered measures against problems associated with an adjustment of an output of a laser light source as described above and have proposed some solutions. For example, Unexamined Japanese Patent Publication No. 2013-15738 discloses a method for facilitating gradation control. More specifically, when image is displayed at low luminance, a laser beam emitted from each laser light source passes through a polarization control element with its angle of polarization adjusted in accordance with a light quantity requirement. In this way, the light quantity from the laser light sources are adjusted so that the gradation is controlled.

Unexamined Japanese Patent Publication No. 2013-226746 discloses a method for rewriting data into a lookup table. In this method, light quantities of a laser light source are obtained at predetermined intervals in accordance with a temperature at the power-on. Then, an input-output property of the laser light source is linearly interpolated using the maximum and minimum of the light quantities obtained.

Unexamined Japanese Patent Publication No. 2014-186078 discloses a method for decreasing a temperature load on a laser light source. In this method, when its surrounding temperature rises, a device uses optical detectors to control currents flowing to respective laser light sources while maintaining white balance. More specifically, the device decreases a current flowing to a laser light source whose temperature has greatly risen so that the temperature falls. In short, the device decreases luminance while maintaining a white color.

Unexamined Japanese Patent Publication No. 2015-22096 discloses a method for finely controlling luminance and gradations. In this method, current flowing to a laser light source and a high-frequency signal wave to be superimposed on the current are adjusted.

Unexamined Japanese Patent Publication No. 2015-64539 discloses a method for controlling an output of a laser light source based on the combination of applied voltage and a light-emitting time.

SUMMARY

According to a first aspect of the present disclosure, an image display device includes a laser light source, a controller, a temperature acquisition unit, and an image forming unit. The laser light source emits a plurality of laser beams including a red laser beam, a green laser beam, and a blue laser beam. The controller controls lighting of the laser light source. The temperature acquisition unit obtains temperature information with respect to the laser light source. The image forming unit creates an image from the plurality of laser beams emitted from the laser light source. The controller varies a light output ratio between the plurality of laser beams, based on the temperature information obtained by the temperature acquisition unit.

According to a second aspect of the present disclosure, an image display device includes a laser light source, a controller, a temperature acquisition unit, and an image forming unit. The laser light source emits a plurality of laser beams including a red laser beam, a green laser beam, and a blue laser beam. The controller controls lighting of the laser light source. The temperature acquisition unit obtains temperature information with respect to the laser light source. The image forming unit creates an image from the plurality of laser beams emitted from the laser light source. When a red color is displayed, the controller varies a light output ratio between the red laser beam and the green laser beam, based on the temperature information obtained by the temperature acquisition unit.

According to a third aspect of the present disclosure, an image display device includes a laser light source, a controller, a temperature acquisition unit, and an image forming unit. The laser light source emits a plurality of laser beams including a red laser beam, a green laser beam, and a blue laser beam. The controller controls lighting of the laser light source. The temperature acquisition unit obtains temperature information with respect to the laser light source. The image forming unit creates an image from the plurality of laser beams emitted from the laser light source. When a blue color is displayed, the controller varies a light output ratio between the blue laser beam and the green laser beam, based on the temperature information obtained by the temperature acquisition unit.

According to the present disclosure, an image display device is capable of: suppressing a reduction in luminance of a display with a single color during an operation at high temperature in which an output property of a laser light source may be degraded; and finely adjusting luminance and gradations of a dark display for which a large quantity of laser light is not required.

BRIEF DESCRIPTION OF THE DRAWINGS

FIG. 6 is a 1931 chromaticity diagram showing red color display ranges in the exemplary embodiment of the present disclosure;

DETAILED DESCRIPTION OF EMBODIMENT

Figure 1A:
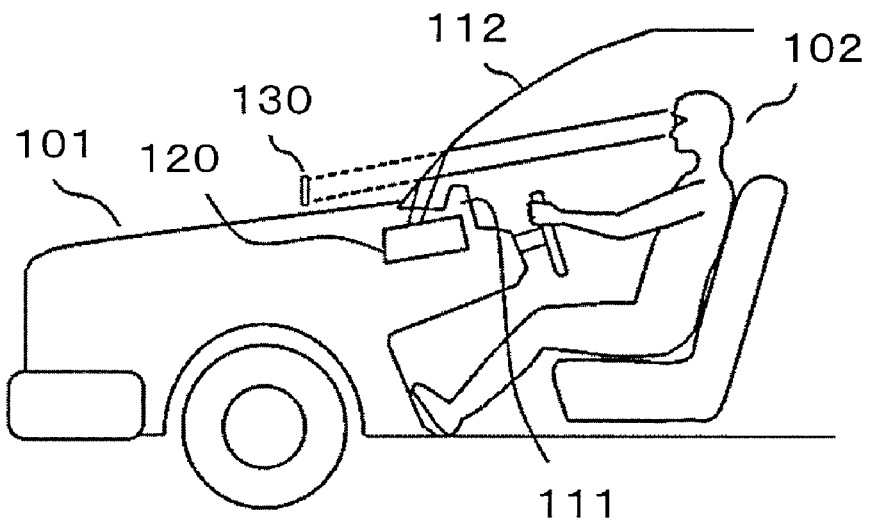
FIG. 1A is a schematic view of an application of an image display device in an exemplary embodiment of the present disclosure.

Prior to a description of an exemplary embodiment of the present disclosure, problems with the conventional configurations will be described below. The configuration disclosed in Unexamined Japanese Patent Publication No. 2013-15738 requires polarization control elements, each of which includes a pair of liquid crystal panel and polarization plates, for respective red, green, and blue lasers. In addition, the configuration also requires control circuits and drive power sources dedicated to these polarization control elements. In addition, when the configuration operates at low temperature, preheating is needed. Thus, the configuration may involve complicated control processing, thus failing to provide good usability. Moreover, blue laser light with a certain wavelength risks accelerating deterioration of the elements.

The configuration disclosed in Unexamined Japanese Patent Publication No. 2013-226746 determines an input-output property of the laser light source by obtaining light quantities at the power-on and at regular intervals and making the interpolation at the maximum and minimum points. Therefore, when the surrounding temperature varies during an operation of a device equipped with the configuration, the input-output property of the laser light source determined in the above manner may differ from an actual one. In addition, the configuration may involve an additional process step of reobtaining light quantities during the display of image.

The configuration disclosed in Unexamined Japanese Patent Publication No. 2014-186078 has temperature sensors attached to respective red, green, and blue laser light sources and decreases the current flowing to the laser light sources so that each temperature falls within a guarantee operating temperature range while maintaining the white balance. Therefore, as a temperature of each laser light source increases, luminance of a white color may decrease, and what is more a displayed content, especially with a red color may become unclear.

The configuration disclosed in Unexamined Japanese Patent Publication No. 2015-22096 adjusts luminance by varying a frequency and amplitude of a high-frequency signal to be superimposed on the laser drive current wave. If this configuration is incorporated into a scanning projector, for example, it is difficult to adjust luminance over a wide range. This is because the configuration needs to correct a light quantity, such as luminance of the display screen, by adjusting a lighting time of the light source or the laser drive current wave.

The configuration disclosed in Unexamined Japanese Patent Publication No. 2015-64539 controls an output of a laser light source based on the combination of applied voltage and a light-emitting time. However, it is difficult to control an output of the laser light source based on the applied voltage. This is because a laser has a property in which its output is sensitive to the applied voltage. In other words, the output varies greatly with varying voltage.

The present disclosure, which addresses problems as described above, provides an image display device capable of: suppressing a reduction in luminance of a display with a single color during an operation at high temperature; and finely adjusting luminance and gradations of a low-luminance display.

An image display device in some exemplary embodiments of the present disclosure will be described below with reference to the accompanying drawings.

Figure 1B:
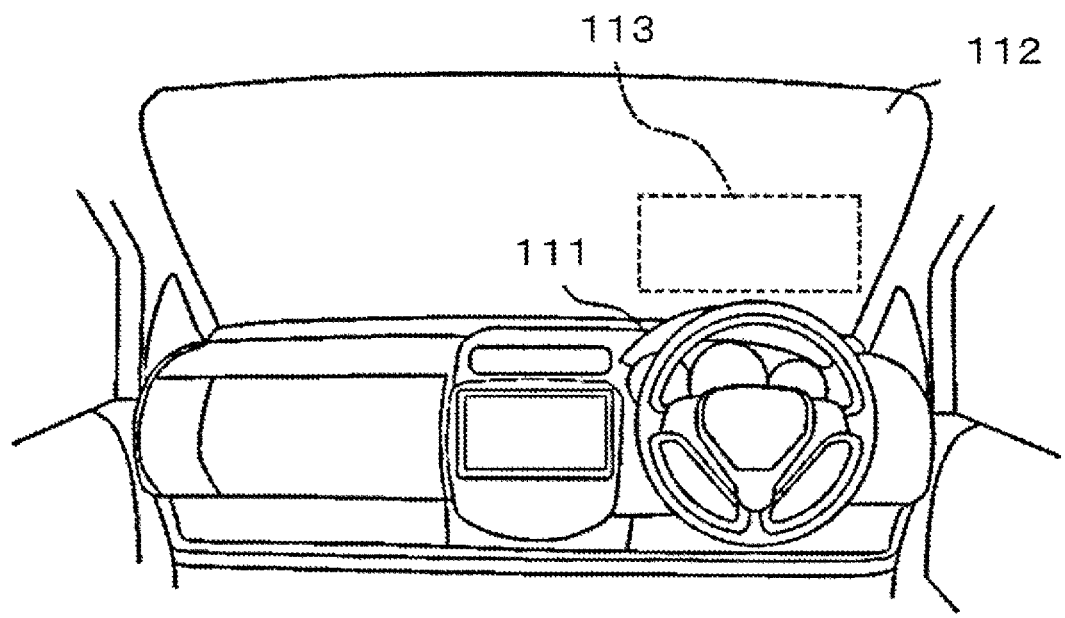
FIG. 1B is another schematic view of the application of the image display device in the exemplary embodiment of the present disclosure.
Figure 1C:
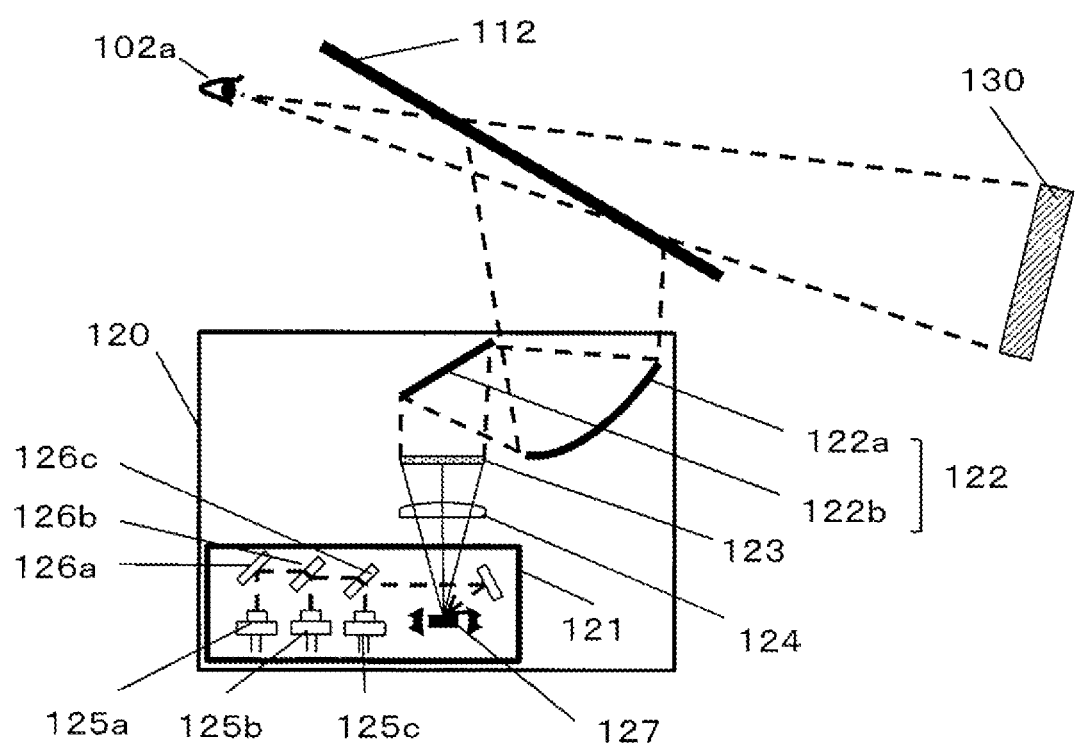
FIG. 1C is a schematic view of a configuration of the image display device in the exemplary embodiment of the present disclosure.

FIG. 1A and FIG. 1B are schematic views of an application of image display device 120 in an exemplary embodiment of the present disclosure. More specifically, FIG. 1A illustrates the interior of vehicle 101 in a see-through manner as seen from its one side; FIG. 1B illustrates a view as seen from the interior of vehicle 101 in a forward direction of vehicle running; and FIG. 1C illustrates an internal configuration of image display device 120. This exemplary embodiment describes a head-up display mounted in a vehicle, to which the present disclosure is applied.

As illustrated in FIG. 1A, image display device 120 is installed in dashboard 111 of vehicle 101. As illustrated in FIG. 1A and FIG. 1B, image display device 120 irradiates projection area 113, which is a lower part of windshield 112 near the driver seat, with laser light (laser beam) modulated with an image signal.

The laser light (laser beam) is reflected on projection area 113 and incident on a horizontally long region (eye box region) in the vicinity of the eyes of driver 102. As a result, predetermined image 130 appears within the field of front view of driver 102 as a virtual image. This enables driver 102 to view image 130, or the virtual image, that overlaps a landscape in front of windshield 112. In other words, image display device 120 creates image 130, or the virtual image, within a space in front of projection area 113 of windshield 112.

As illustrated in FIG. 1C, image display device 120 includes optical scanning module 121, virtual image optical system 122, screen 123, and screen incident angle correction optical system 124. Optical scanning module 121 includes LD 125a, LD 125b, and LD 125c and outputs laser beams modulated with an image signal. LD 125a, LD 125b, and LD 125c are laser diodes (referred to below as "LDs") acting as light sources that emit blue light, green light, and red light.

In the present disclosure, LD 125a is a semiconductor blue laser light source, LD 125b is a semiconductor green laser light source, and LD 125c is a semiconductor red laser light source. In FIG. 1C, LD 125a, LD 125b, and LD 125c are mounted in independent CAN packages; however, this structure is exemplary. Alternatively, arbitrary two LDs out of LD 125a, LD 125b, and LD 125c may be mounted in a single CAN package, or all of LD 125a, LD 125b, and LD 125c may be mounted in a single CAN package.

The laser beams emitted from LD 125a, LD 125b, and LD 125c are shaped into laser beams substantially coaxial with one another by optical multiplexing mirror 126a, optical multiplexing mirror 126b, and optical multiplexing mirror 126c and then incident on scan mirror 127. After that, screen 123 is scanned with the laser beams by both scan mirror 127 and screen incident angle correction optical system 124.

Scan mirror 127 has two rotational axes, which are denoted as a high-speed axis and a low-speed axis for the sake of convenience. Scan mirror 127 rotates clockwise and counterclockwise around the high-speed axis at a resonant frequency of approximately 20 kHz. Likewise, scan mirror 127 rotates clockwise and counterclockwise around the low-speed axis at a frequency (60 Hz in this exemplary embodiment) related to a frame rate of an image to be displayed.

Hereinafter, in this exemplary embodiment, an axis drawn along the high-speed axis is defined as a horizontal axis; an axis drawn along the low-speed axis is defined as a vertical axis. In this exemplary embodiment, a first scanning is performed along the horizontal axis; a second scanning is performed along the vertical axis. The horizontal axis is orthogonal to the vertical axis. The first scanning is performed at a higher speed than the second scanning.

Virtual image optical system 122 includes reflecting surface 122a and reflecting surface 122b; reflecting surface 122a has a curved surface, and reflecting surface 122b has a flat surface. The laser beams emitted from optical scanning module 121 pass through screen incident angle correction optical system 124 and screen 123 in this order. Then, the laser beams are reflected and directed to windshield 112 by virtual image optical system 122.

The laser beams are reflected by windshield 112 and then incident on eyes 102a of driver 102. Both the optical system of optical scanning module 121 and virtual image optical system 122 are designed such that a virtual image, that is, image 130, having a predetermined size appears in front of windshield 112.

The foregoing exemplary embodiment is applied to a windshield type head-up display that allows a driver to view a virtual image over a windshield. However, the exemplary embodiment may also be applied to a combiner type head-up display that allows a driver to view a virtual image with an optical component called a combiner.

This exemplary embodiment employs an optical configuration called micro electro mechanical systems (MEMS), in which mirrors rotate clockwise and counterclockwise by means of a distortion effect of a piezoelectric material, an electromagnetic force, or an electrostatic force. However, the exemplary embodiment may employ any given optical configuration that can scan a screen with laser light, such as an optical configuration having a polygon mirror or a galvanometer optical scanner.

When an optical magnification of virtual image optical system 122 is set to a greater value, image display device 120 having a more compact body can generate image 130. In this case, image display device 120 can be advantageously installed within a limited space in a vehicle.

Next, a description will be given of an image display device that employs a conventional method for adjusting an output of a laser light source in accordance with ambient temperature and a conventional method for adjusting an output of a laser light source in accordance with target display luminance. In the conventional art, a white balance of a display with a white color is used as a reference, and the quantities of red light, green light, and blue light are set such that an appropriate white balance value is obtained in accordance with display luminance.

Figure 2A:
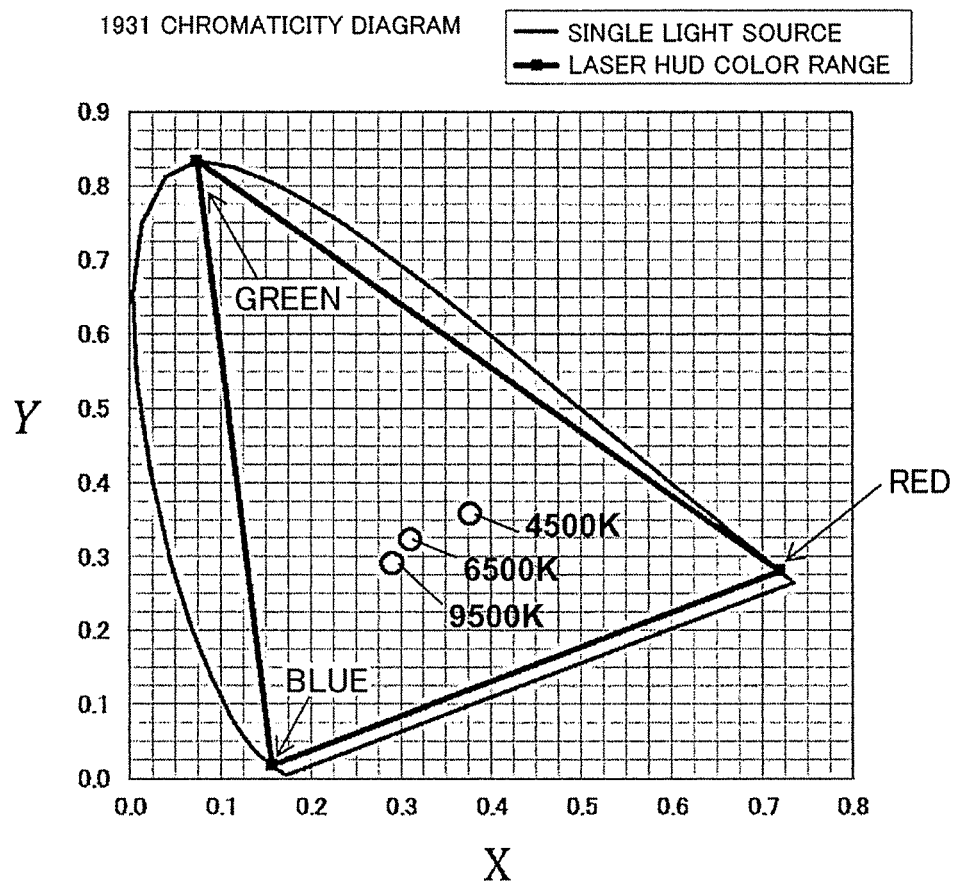
FIG. 2A is a 1931 chromaticity diagram in which some white points are present.
Figure 2B:
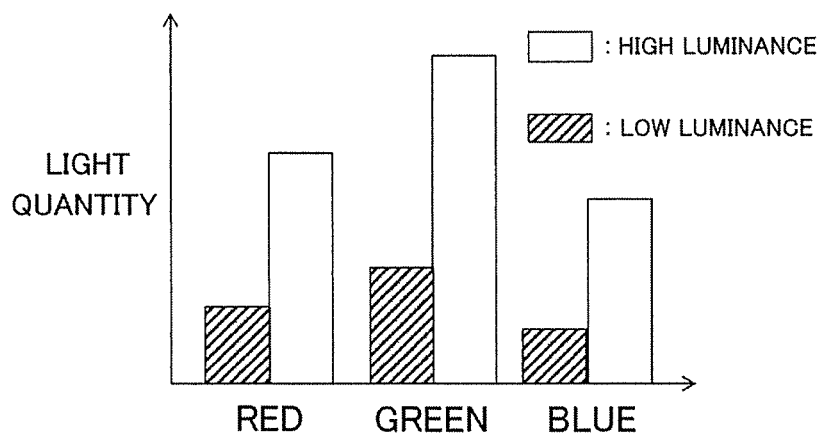
FIG. 2B is a bar chart, which is used to explain a method for adjusting luminance in a conventional image display device.

FIG. 2A is a 1931 chromaticity diagram; FIG. 2B shows light-quantity ratios of red light, green light, and blue light in an image display device at high luminance and at low luminance. First, a range of a white color is determined in accordance with a product. The white color can be represented by any given shade in a color temperature range from 4500 K (reddish white) to 9500 K (bluish white).

For example, a white color having a color temperature of 9500 K is defined as a white color, and the quantities of red light, green light, and blue light used to create the white color having the maximum luminance are set in accordance with those at "high luminance" in the bar chart of FIG. 2B.

In this conventional method for adjusting luminance, even when a single color light, such as red light, green light, or blue light, is output, the maximum quantity of this single color light is set to up to a corresponding maximum quantity in the bar chart.

Likewise, the quantities of red light, green light, and blue light used to create the white color having the minimum luminance are set in accordance with those at "low luminance" in the bar chart of FIG. 2B. In this case, the quantities of red light, green light, and blue light are also determined based on the light-quantity ratio for the white color. Therefore, when a single color light, such as red color or blue color, is displayed, the quantity of this single color light may be too small for a driver to visually perceive the display.

Figure 3A:
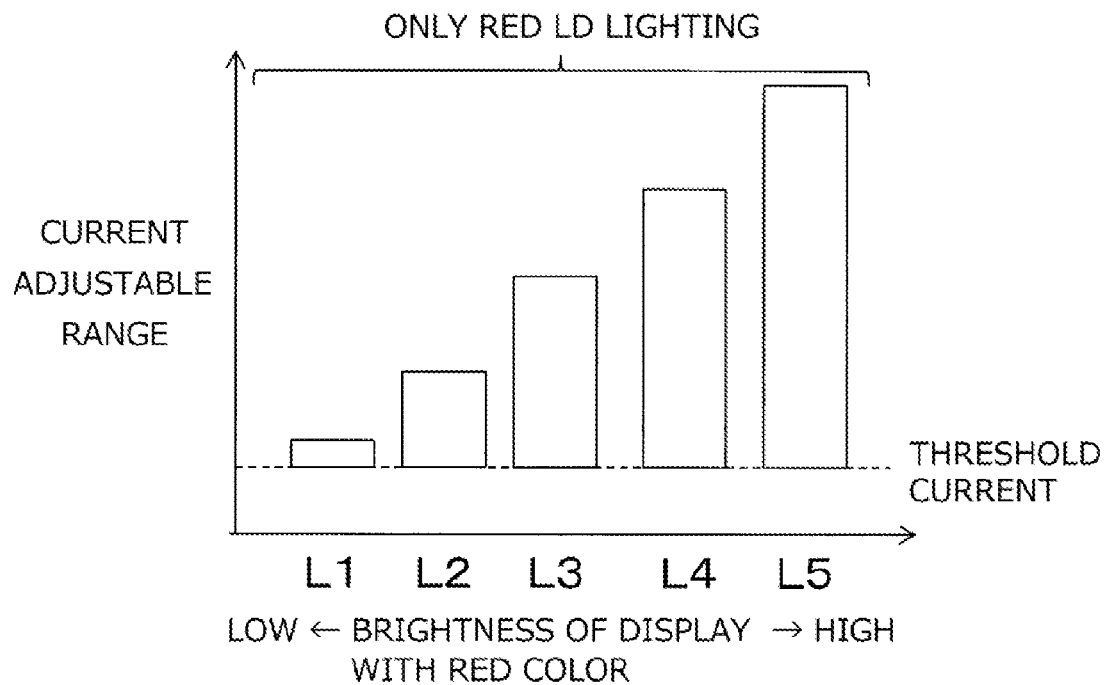
FIG. 3A is a bar chart, which shows a relationship between brightness of the red color and a current adjustable range when a conventional image display device displays a red color.

When the white color is displayed at the minimum luminance, the following additional problems may arise. FIG. 3A shows target luminance levels (L1: minimum luminance to L5: maximum luminance) for the image display device on the vertical axis. Each current adjustable range of the red light source is determined from the difference between the threshold current and the maximum current. As shown in FIG. 3A, the current adjustable range at the minimum luminance "L1" is much narrower than that at the maximum luminance "L5". Therefore, when the luminance decreases, it may be difficult to clearly display gradations of the colors.

Figure 3B:
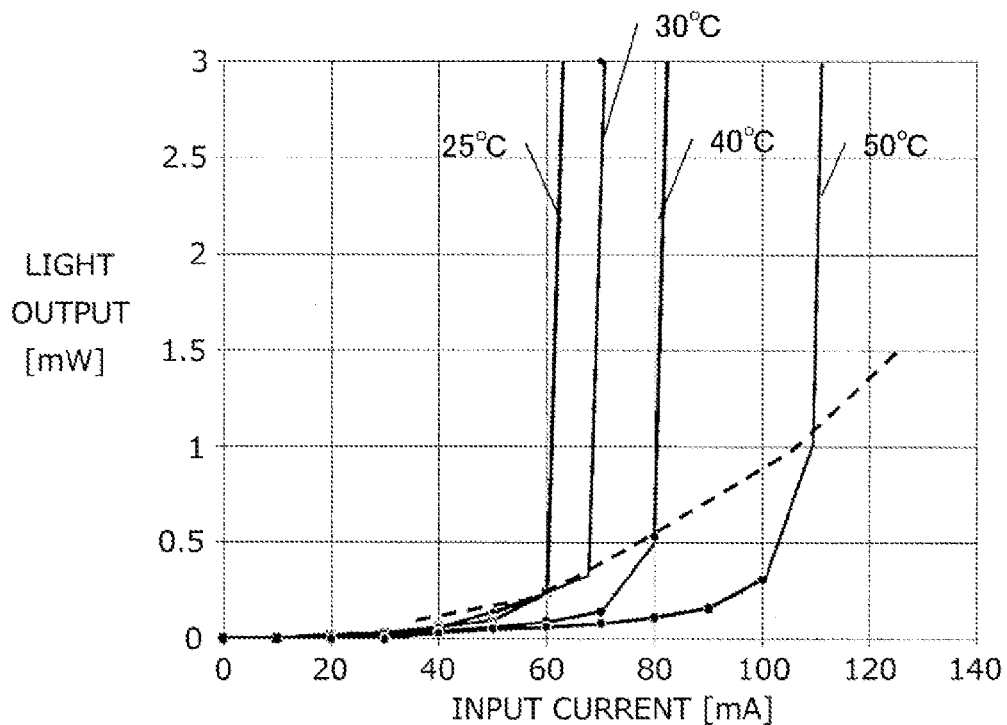
FIG. 3B is a graph showing an output property of a red laser light source at or near its oscillation threshold current.

FIG. 3B shows the current adjustable ranges of a red laser light source plotted on the vertical axis. More specifically, FIG. 3B shows the relationship between input current and light output of an LD in a 640 nm band, in which temperatures are used as parameters. As shown in FIG. 3B, the threshold current of a red laser light source having a certain wavelength increases with a rise in temperature. Therefore, the input current may be difficult to adjust at high temperature. In addition, an increasing quantity of spontaneous emission light, which is output from a red laser light source before an occurrence of a laser oscillation, may cause gradations to be further unclear.

A method for employing pulse width modulation in which a pulse width is varied to adjust a pulse has been conventionally proposed as a method for adjusting a light quantity, other than the method by adjusting input current. However, a MEMS scanning display device needs to control a light emission pulse for the purpose of not only adjusting luminance but also correcting a luminance distribution on a display screen or superimposing a high-frequency wave on input current to reduce speckle noise. Thus, a pulse width may be difficult to adjust over a wide range. It can be found from FIG. 3B that as the temperature increases, the threshold currents increase and the quantities of spontaneous emission light that is output from the red laser light source before an occurrence of a laser oscillation gradually increase.

Figure 4A:
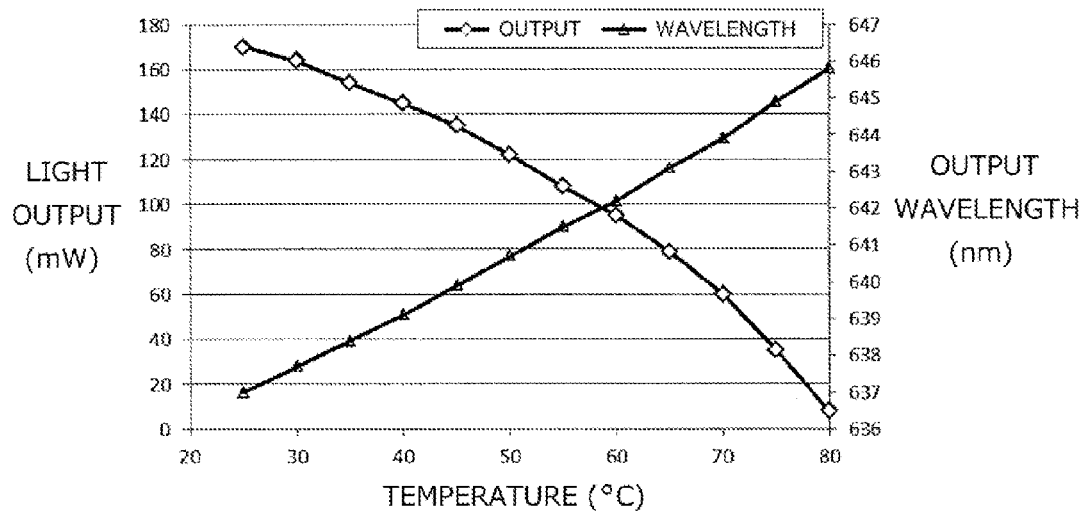
FIG. 4A is a graph showing an exemplary property of a red laser diode in a 640 nm band with respect to temperature.
Figure 4B:
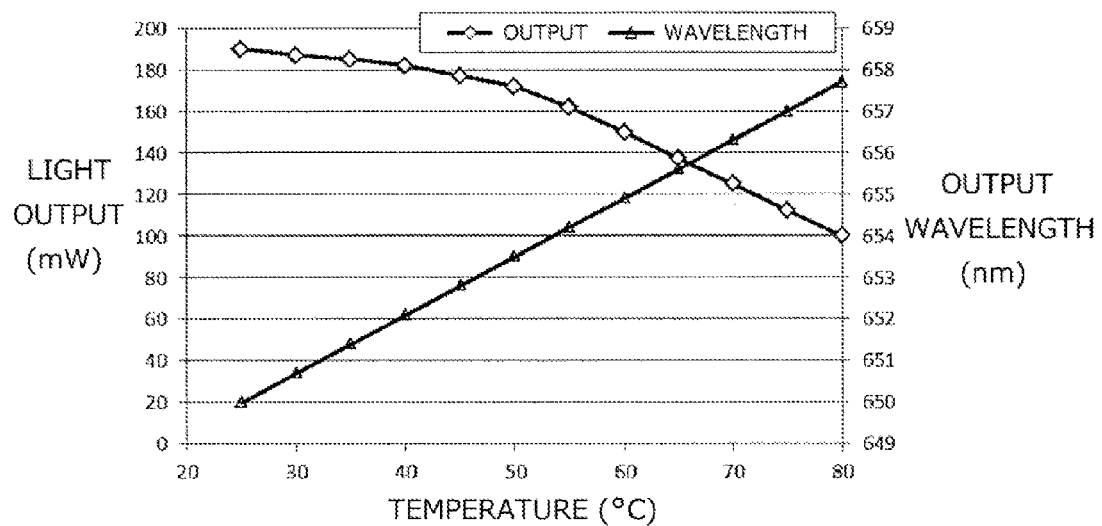
FIG. 4B is a graph showing an exemplary property of a red laser diode in a 650 nm band with respect to temperature.

FIG. 4A and FIG. 4B show temperature properties of red LDs having different oscillation wavelengths. More specifically, FIG. 4A shows the relationship between temperature (plotted on the horizontal axis) and both light output and output wavelength (plotted on the vertical axis) of an LD in a 640 nm band. FIG. 4B shows the relationship between temperature (plotted on the horizontal axis) and both light output and output wavelength (plotted on the vertical axis) of an LD in a 650 nm band. When the temperatures vary from 25° C. to 80° C., the light output of the LD in a 640 nm band and the light output of the LD in a 650 nm band decrease at different rates, because their quantum well structures differ from each other. More specifically, as can be seen from FIG. 4A, the light output of the LD in a 640 nm band decreases from 170 mW to 10 mW in the above temperature range. In other words, 90% or more of the light output of the LD in a 640 nm band decreases. As can be seen from FIG. 4B, the light output of the LD in a 650 nm band decreases from 190 mW to 100 mW in the above temperature range. In other words, only approximately 50% of the light output of the LD in a 650 nm band decreases.

The light output of the LD in a 650 nm band decreases at a lower rate with increasing temperature than that of the LD in a 640 nm band. This property is generally known among those skilled in the art. However, if light of an LD is used in an image display device, it is necessary to consider stimulation (luminosity factor) that the light of LD gives human eye, because the luminosity factor may affect characteristics of the image display device.

Figure 5A:
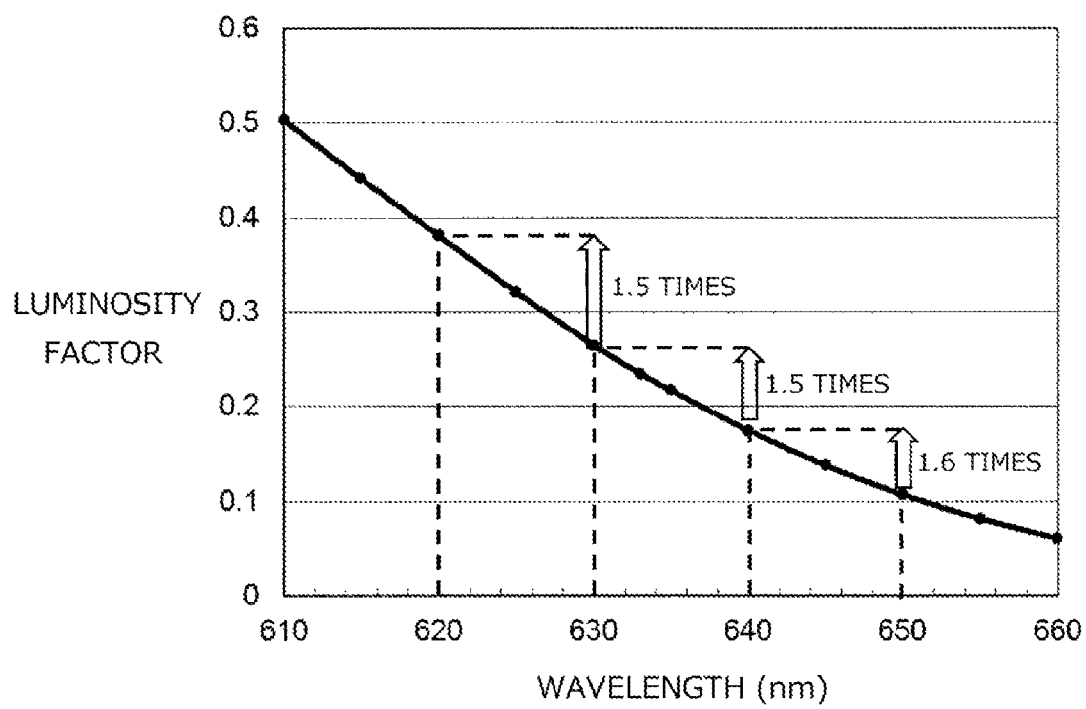
FIG. 5A is a graph showing a relationship between a wavelength in the red wavelength band and a luminosity factor.

FIG. 5A shows a relationship between a wavelength and a luminosity factor in a red wavelength band. As can be seen from FIG. 5A, the luminosity factor of light at a wavelength of 650 nm is nearly equal to 60% of that at a wavelength of 640 nm. Furthermore, the luminosity factor of light at a wavelength of 630 nm, which is also red light, is approximately 1.5 times as high as that at a wavelength of 640 nm. The luminosity factor of light at a wavelength of 620 nm is approximately 2.3 times as high as that at a wavelength of 640 nm.

Figure 5B:
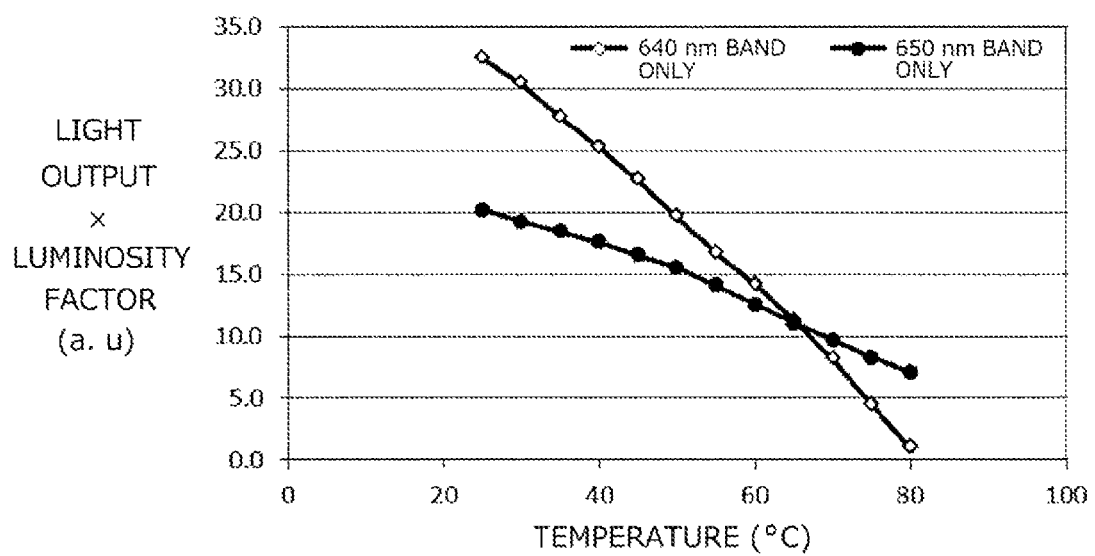
FIG. 5B is a graph showing a relationship between an ambient temperature and an intensity of a red color which a human visually perceives.

FIG. 5B shows a relationship between a temperature and a light output, in which a luminosity factor is considered. In FIG. 5B, the horizontal axis represents temperature adjacent to each LD (referred to below as ambient temperature), and the vertical axis represents values (arbitrary unit) obtained by multiplying light outputs of each LD by luminosity factors. It can be found from FIG. 5B that the LD in a 640 nm band is superior to the LD in a 650 nm band at or near an ambient temperature of 20° C. but the LD in a 650 nm band is superior to the LD in a 640 nm band at ambient temperatures more than 60° C.

The present disclosure proposes a control method that utilizes properties of semiconductor laser light sources as described above and, even if an LD in a 650 nm band whose output property gradually varies with temperature is used, makes it possible to display a red color with a minimal reduction in its visibility and to decrease luminance even for low-luminance display.

According to an exemplary embodiment of the present disclosure, an image display device causes a red LD and a green LD to emit lights together when displaying a red color, so that the green LD assists the red LD to the extent to which the color of the output light is visually perceived to be red. This makes it possible to display bright red light. Furthermore, when decreasing luminance, the image display device stops the assist of the green LD and uses red light alone whose luminosity factor is low. This makes it possible to display less bright red light than conventionally.

A detailed description will be given below of a configuration and control of an image display device in the exemplary embodiment of the present disclosure, with reference to FIG. 6 to FIG. 12.

FIG. 6 illustrates a 1931 chromaticity diagram with the red color range enlarged. In FIG. 6, the dotted line is a straight line that passes through both the points of 525 nm and 660 nm in the chromaticity diagram and can be expressed by Y=−0.903X+0.929 (referred to below as "Equation 1"). The solid line is a straight line that passes through both the points of 515 nm and 660 nm in the chromaticity diagram and can be expressed by Y=−0.784X+0.843 (referred to below as "Equation 2").

When a red color is displayed so as to satisfy a visibility requirement, the image display device causes the green LD to supplementarily emit light such that the output light coincides with red-colored coordinates within region A ($-0.784X+0.843 \leq Y \leq -0.903X+0.929$ and $0.690 \leq X \leq 0.715$) in FIG. 6, which is defined by both Equations 1 and 2.

When less bright red light is displayed, the image display device controls the green LD such that the output light coincides with red coordinates within region B ($-0.784X+0.843 \leq Y \leq -0.903X+0.929$ and $0.725 \leq X \leq 0.730$) in FIG. 6.

When a red color is displayed, the image display device causes both a red LD and a green LD to emit lights so as to fall within region A in the chromaticity diagram. In this way, it is possible to provide a display with its brightness ensured and with its color visually perceived to be "red". When a brighter "red" color is displayed, the image display device increases the supplemental light quantity of the green LD such that the output light approaches an X coordinate of 0.690. When a less bright "red" color is displayed, the image display device decreases the supplemental light quantity of the green LD such that the output light approaches an X coordinate of 0.715. In this way, it is possible to provide a display with its brightness lowered.

In the above description, the red color region is defined by the two straight lines expressed by Equations 1 and 2. This is because a wavelength of light output from the green LD, which acts as a supplemental light source, varies with temperature and due to variations in property. Equation 1 expresses a straight line that passes through both the longer side of the wavelength range of green light and a point of 660 nm, which is a long wavelength value of the red LD. Equation 2 expresses a straight line that passes through both the shorter side of the wavelength range of green light from the green LD and a point of 660 nm, which is a long wavelength value of the red LD. Introducing the control method in this manner can reliably satisfy an intensity requirement for red light even at high ambient temperature.

Figure 7A:
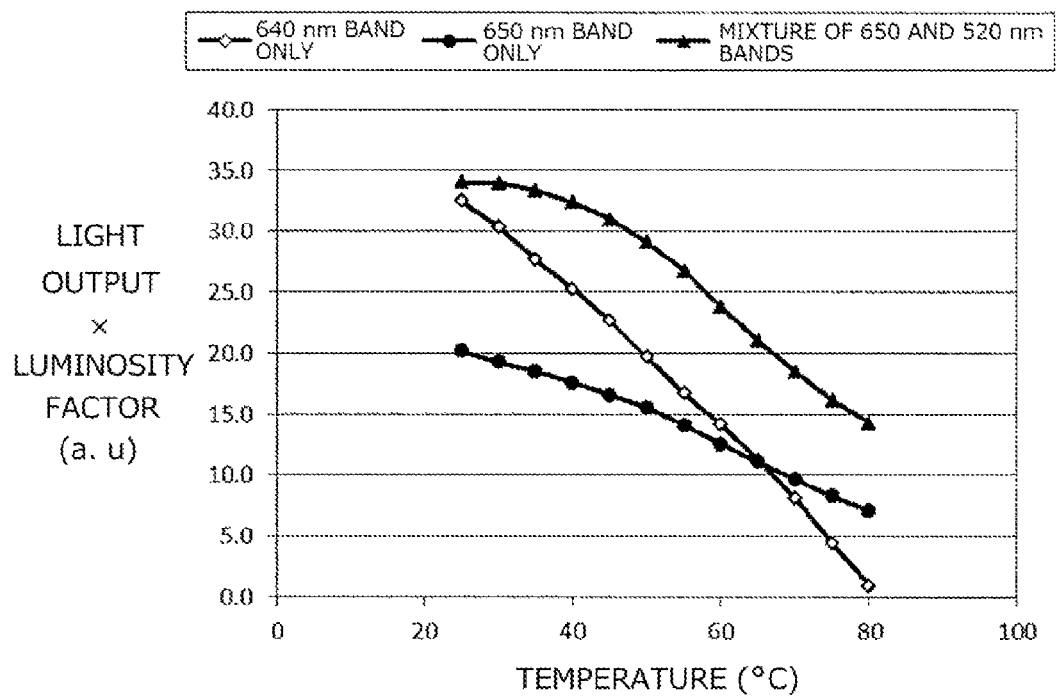
FIG. 7A is a graph showing a relationship, in the exemplary embodiment of the present disclosure, between an ambient temperature and an intensity of a red color which a human visually perceives.

FIG. 7A shows a variation in intensity of red light with ambient temperature which is perceived by the human eye when the green LD supplementarily emits light. In FIG. 7A, the horizontal axis represents ambient temperature; vertical axis represents values (arbitrary unit) obtained by multiplying light outputs of an LD or LDs by luminosity factors. It can be found that, when the green LD supplementarily emits light, the image display device can display red light at an ambient temperature of 80° C. with its brightness being approximately twice as much as brightness of light emitted from the LD in a 650 nm band alone and approximately 15 times as much as brightness of light emitted from the LD in a 640 nm band alone.

Figure 7B:
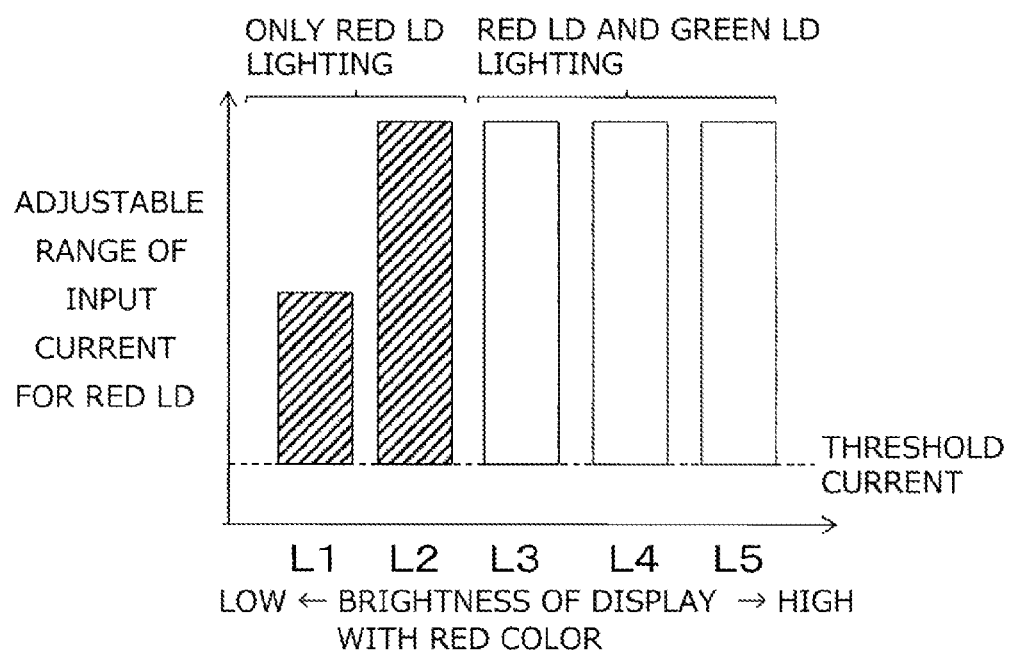
FIG. 7B is a bar chart, which shows a relationship between a brightness of a displayed red color and an adjustable range of current flowing to the red laser diode.

FIG. 7B shows an adjustable range of current flowing to the red LD for low-luminance display. The horizontal axis represents the target luminance (L5: maximum luminance to L1: minimum luminance); the vertical axis represents an adjustable range of current flowing to the red LD. When a red color is displayed, the image display device causes the green LD to supplementarily emit light. In this case, the image display device lowers brightness of the displayed red color within a range from luminance L3 to luminance L5 by decreasing the light quantity of the green light. Thus, it is possible to control the quantity of output light without narrowing an adjustable range of current flowing to the red LD. When brightness equal to or lower than luminance L2 is required, the image display device causes the red LD to emit light alone. Then, the image display device controls brightness of the displayed red color by adjusting the current flowing to the red LD.

The image display device in the present disclosure has a red LD in a 650 nm band, whose luminosity factor is low. When providing a display at low luminance, the image display device outputs red light within region B in the chromaticity diagram of FIG. 6 without an assist of green light. In this way, it is possible to ensure a current adjustable range even at low luminance.

Figure 8:
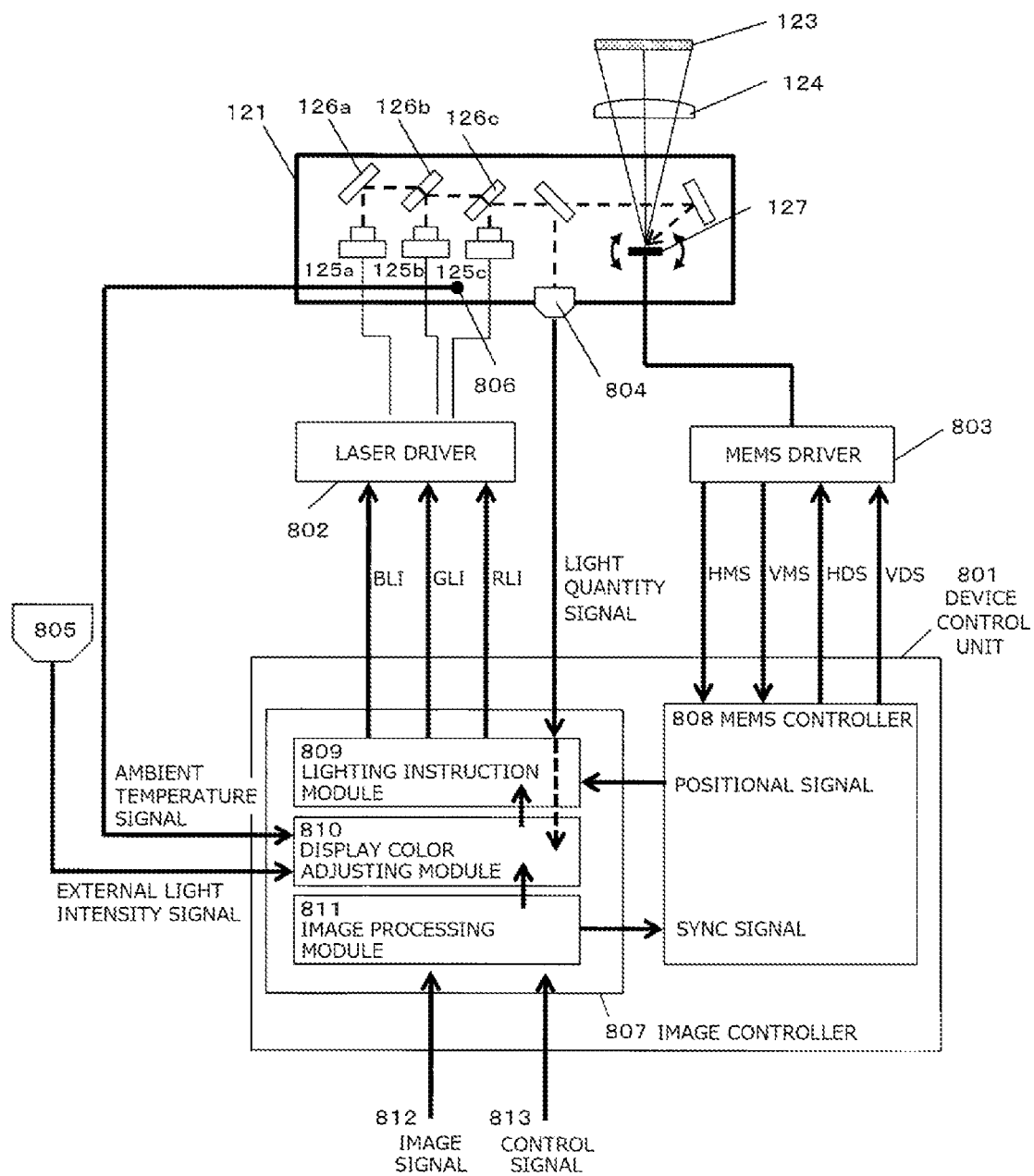
FIG. 8 is a block diagram schematically illustrating a configuration of the image display device in the exemplary embodiment of the present disclosure.

FIG. 8 is a block diagram illustrating a configuration of the image display device in the present disclosure. In FIG. 8, LD 125*a* (green), LD 125*b* (blue), LD 125*c* (red), and scan mirror 127 are controlled based on instructions from device control unit 801 via laser driver 802 and MEMS driver 803. Herein, scan mirror 127 corresponds to an image forming unit. Laser driver 802 supplies current to LD 125*a*, LD 125*b*, and LD 125*c*; MEMS driver 803 supplies a drive voltage signal to scan mirror 127.

Device control unit 801 receives, as external inputs, image signal 812 and control signal 813. Control signal 813 is used to control a display state (displaying or not displaying) of the image display device. Moreover, device control unit 801 receives a light quantity signal from light quantity monitor 804 which measures quantities of lights emitted from LD 125*a*, LD 125*b*, and LD 125*c*. Device control unit 801 receives an external light intensity signal from external light intensity monitor 805 (luminance acquisition unit) which measures brightness of light external to the image display device. Device control unit 801 receives an ambient temperature signal from temperature monitor 806 (temperature acquisition unit) which measures an ambient temperature of LD 125*a*, LD 125*b*, and LD 125*c* (desirably, a measurement of a temperature adjacent to LD 125*c*). Device control unit 801 receives a horizontal monitor signal/vertical monitor signal from MEMS driver 803.

Image controller 807 includes lighting instruction module 809, display color adjusting module 810, and image processing module 811. Image processing module 811 generates color information regarding images to be displayed at individual coordinates in response to entry of image signal 812. Then, image processing module 811 transmits the generated color information to display color adjusting module 810.

Display color adjusting module 810 enhances visibility of a display with a single color by adjusting the displayed color, in accordance with the light quantity signal from light quantity monitor 804, the external light intensity signal from external light intensity monitor 805, and the ambient temperature signal from temperature monitor 806 (which indicates a temperature adjacent to the laser light sources). Then, display color adjusting module 810 transmits a generated signal to lighting instruction module 809.

Lighting instruction module 809 gives an instruction to laser driver 802 which causes the LDs to emit lights, based on the signal received from display color adjusting module 810. In addition, lighting instruction module 809 performs feedback control by adjusting an instruction value based on the light quantity signal from light quantity monitor 804.

In the present disclosure, display color adjusting module 810 plays an important role by adjusting displayed colors in accordance with the light quantity signal from light quantity monitor 804, the external light intensity signal from external light intensity monitor 805, and the ambient temperature signal from temperature monitor 806.

Next, a description will be given of a control process performed by display color adjusting module 810 included in image controller 807 within device control unit 801, with reference to the flowchart of FIG. 9. Device control unit 801, image controller 807, or display color adjusting module 810 may be implemented using a processor and a memory. The memory stores a program that causes display color adjusting module 810 to perform the control process in the flowchart of FIG. 9.

A simple flow of the control process will be described below. First, display color adjusting module 810 determines whether or not supplement green light is needed when a red color is displayed, based on luminance that image display device 120 requires. If the supplement green light is needed, display color adjusting module 810 determines light quantities of the red LD and the green LD in accordance with a temperature adjacent to the laser light sources.

Display color adjusting module 810 starts the control (901) and then determines whether or not external luminance instruction is present, based on the control signal (902). The external luminance instruction is generated when a user adjusts luminance. The external luminance instruction may be contained in control signal 813 in FIG. 8. As one example, luminance of a display image is adjustable in five steps, in which are steps of luminances L1 to L5, depending on the operation performed by the user.

If the external luminance instruction is present, display color adjusting module 810 determines whether or not the external luminance instruction indicates a value more than a preset value "L2" (903). If the value indicated by the external luminance instruction is equal to or less than the preset value "L2", supplemental green light is not output (905). If the value indicated by the external luminance instruction is more than the preset value "L2", supplemental green light is output (906). Herein, a luminance value equal to or less than the value "L2" to be selected by the user is referred to as a low-luminance mode. A luminance value more than the value "L2" to be selected by the user is referred to as a high-luminance mode. Therefore, when the user selects the low-luminance mode, supplemental green light is not output (905). When the user selects the high-luminance mode, supplemental green light is output (906).

If the external luminance instruction is absent, display color adjusting module 810 determines whether or not the external light intensity signal, which corresponds to intensity of light external to the image display device (obtained from external light intensity monitor 805 as described above), indicates a value more than a preset value "Po" (904). If the value indicated by the external light intensity signal is equal to or less than the value "Po", supplemental green light is not output (905). If the value indicated by the external light intensity signal is more than the value "Po", supplemental green light is output (906). When supplemental green light is not output (905), the display color adjusting module 810 does not perform any processing in response to the signal from image processing module 811 and forwards this signal to lighting instruction module 809.

As described above, if the external luminance instruction is present and the value indicated by the external luminance instruction is more than the value "L2", supplemental green light is output (906). If the external luminance instruction is absent but the value indicated by the external light intensity signal is more than the value "Po", supplemental green light is output (906). In this case, display color adjusting module 810 determines a supplemental proportion of green light in accordance with the ambient temperature signal obtained from temperature monitor 806. The supplemental proportion of green light is determined in the following manner.

If the ambient temperature is in a range of −40° C. to 20° C. (equal to or more than −40° C. and less than 20° C.) (907: YES), display color adjusting module 810 causes the red LD and the green LD to emit lights at a preset mixture ratio (at a light output ratio, green light:red light=0.95:0.05) (908).

If the ambient temperature is in a range of 20° C. to 40° C. (equal to or more than 20° C. and less than 40° C.) (909: YES), display color adjusting module 810 causes the red LD and the green LD to emit lights at a preset mixture ratio (at a light output ratio, green light:red light=0.90:0.10) (910).

When the ambient temperature is in a range of 40° C. to 60° C. (equal to or more than 40° C. and less than 60° C.) (911: YES), display color adjusting module 810 causes the red LD and the green LD to emit lights at a preset mixture ratio (at a light output ratio, green light:red light=0.80:0.20) (912).

When the ambient temperature is in a range of 60° C. to 85° C. (equal to or more than 60° C. and less than 85° C.) (913: YES), display color adjusting module 810 causes the red LD and the green LD to emit lights at a preset mixture ratio (at a light output ratio, green light:red light=0.65:0.35) (914).

However, if negative determinations (No) are made in all of the branches (907), (909), (911), and (913), the display color adjusting module 810 determines that the ambient temperature falls out of a temperature range specified in a specification and outputs a thermal abnormality signal.

The above ambient temperature range and the above mixture ratio (light output ratio between the red LD and the green LD) which are used for the determination are exemplary. It should be understood that these ambient temperature range and light output ratio may be determined arbitrarily in accordance with a configuration of the image display device.

Figure 10:
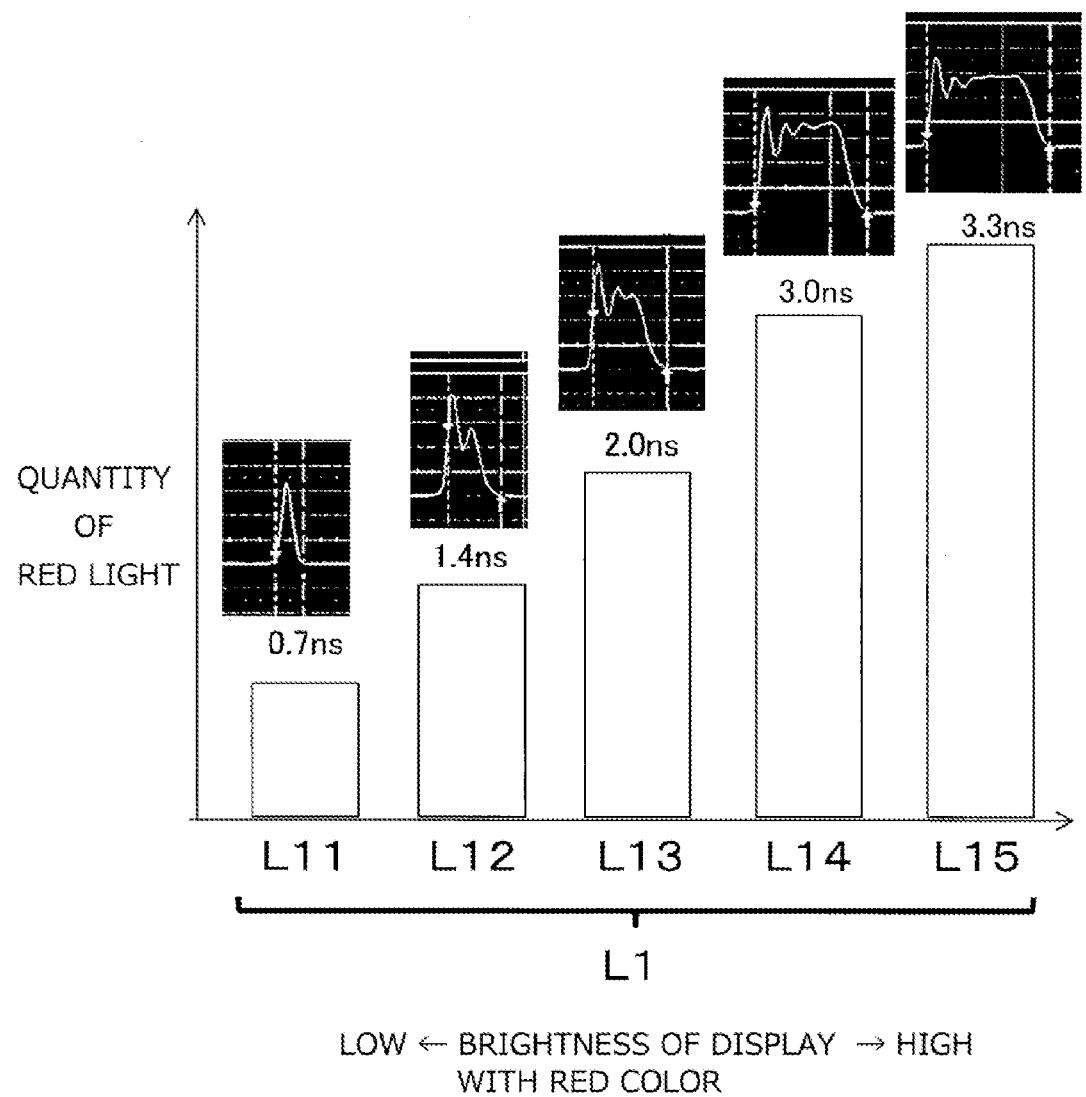
FIG. 10 is a bar chart, which shows a relationship between a brightness of a displayed red color and light quantity.

In the present disclosure, the image display device may further perform pulse width control in the state of luminance "L1" where the brightness of the displayed red color has a minimal value. Performing this additional pulse width control makes it possible to achieve finer control. FIG. 10 shows quantities of red light when the pulse width control is further performed in the luminance L1 mode of FIG. 7B. As can be seen from FIG. 10, as the pulse width varies from 3.3 ns to 0.7 ns, the light quantity decreases. When providing a display at low luminance, the image display device selects a wavelength having a low luminosity factor and further performs the pulse width control, thereby making it possible to control a light quantity more finely.

The description has been given regarding the method for improving visibility and finely controlling a light quantity of a display at low luminance when a red color is displayed. However, the image display device may also employ this method in order to improve visibility when displaying a blue color.

Figure 11:
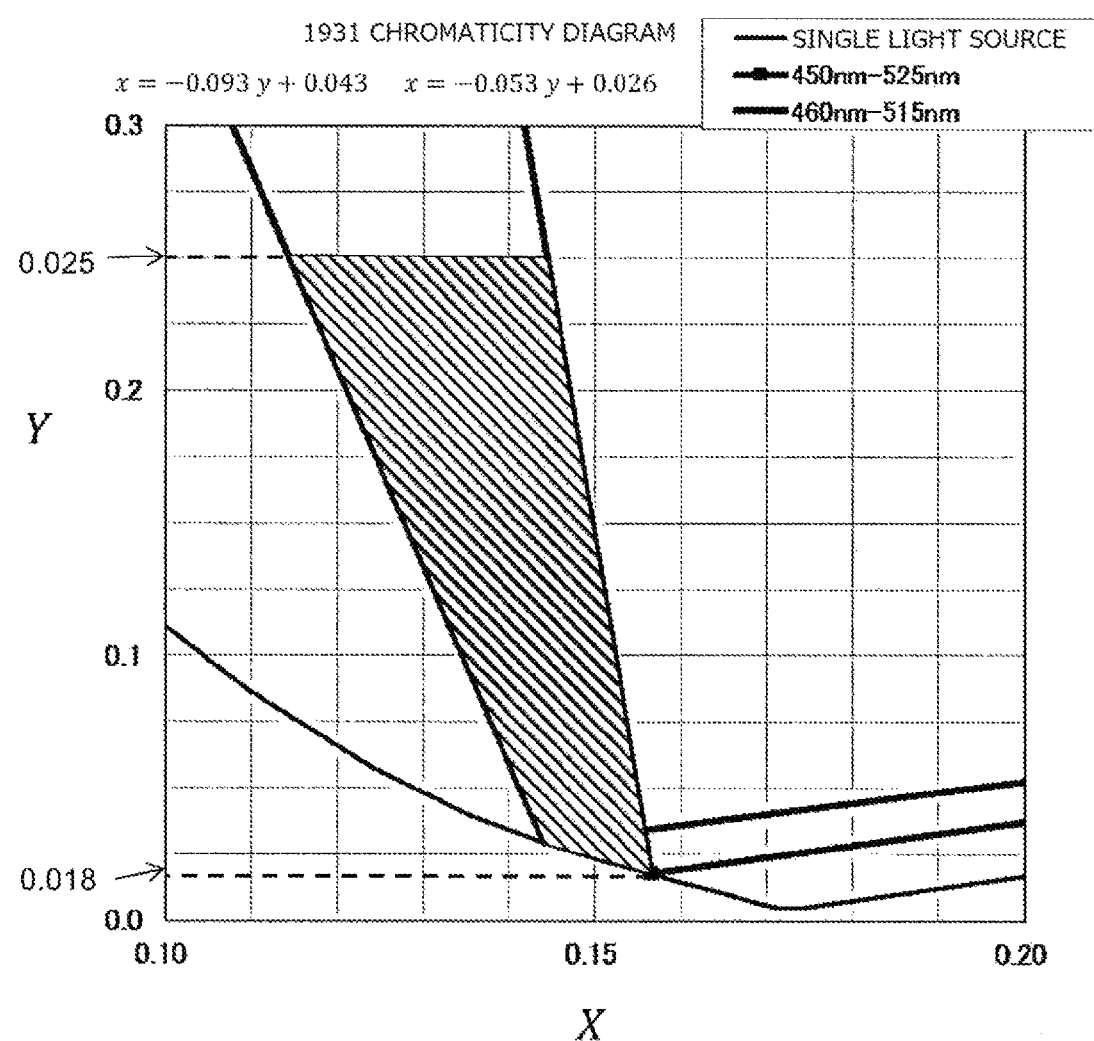
FIG. 11 is a 1931 chromaticity diagram showing a blue color display range in the exemplary embodiment of the present disclosure.

FIG. 11 illustrates a 1931 chromaticity diagram with the blue color region enlarged. In FIG. 11, the hatched region is a color region that can be created by a single light source and defined by −0.093Y+0.043≤X≤−0.053Y+0.026 and 0.018≤Y≤0.025.

Figure 9:
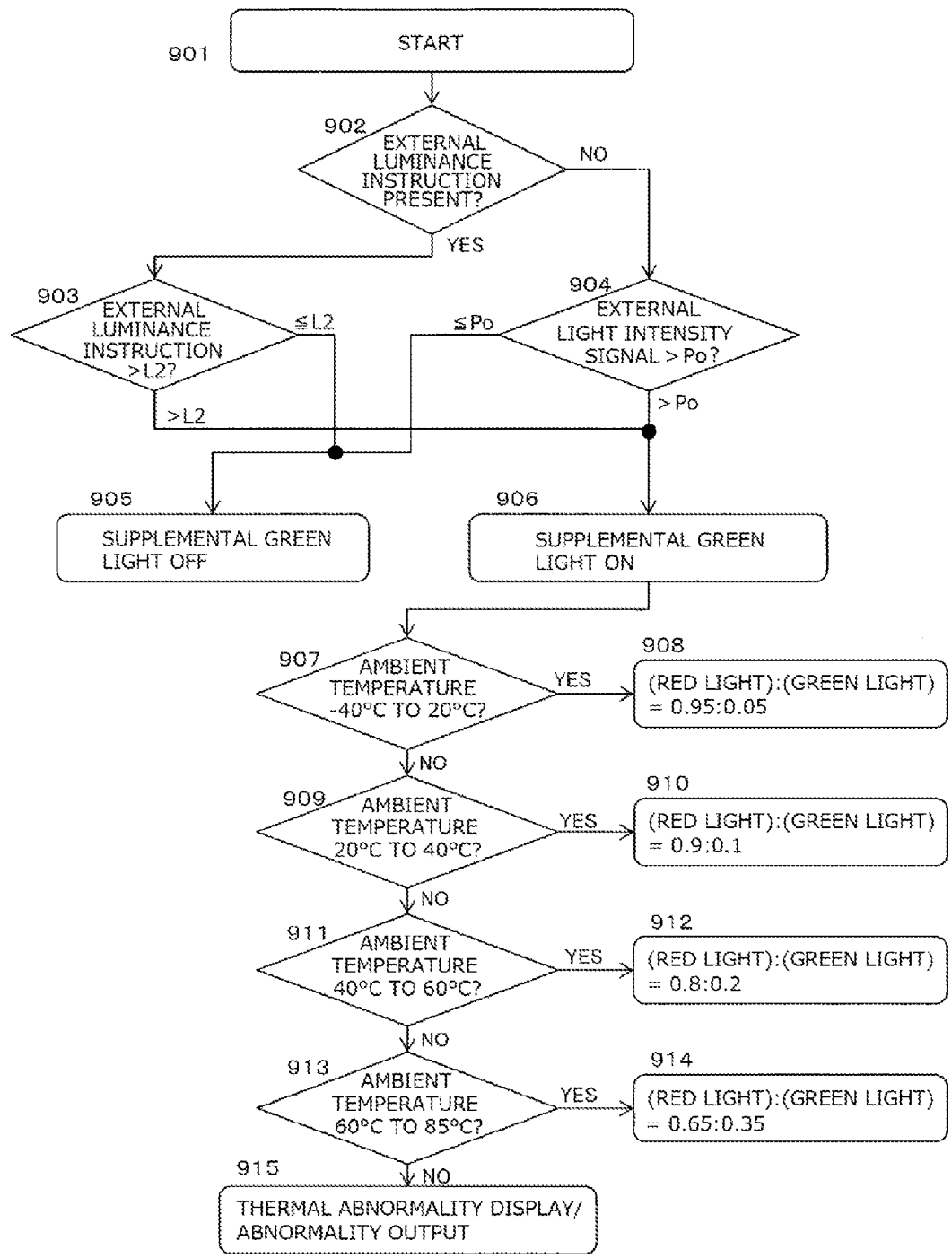
FIG. 9 is a flowchart of a control process performed by the display color adjusting module in the exemplary embodiment of the present disclosure.

Since an output of a blue LD gradually varies with temperature, the process of determining a mixture ratio in accordance with a temperature as shown in (907) to (914) in FIG. 9 may be removed. Thus, image display device 120 may determine whether or not assisting with green light is conducted, based on a value indicated by the external luminance instruction. Details of this will be described with reference to FIG. 12.

Figure 12:
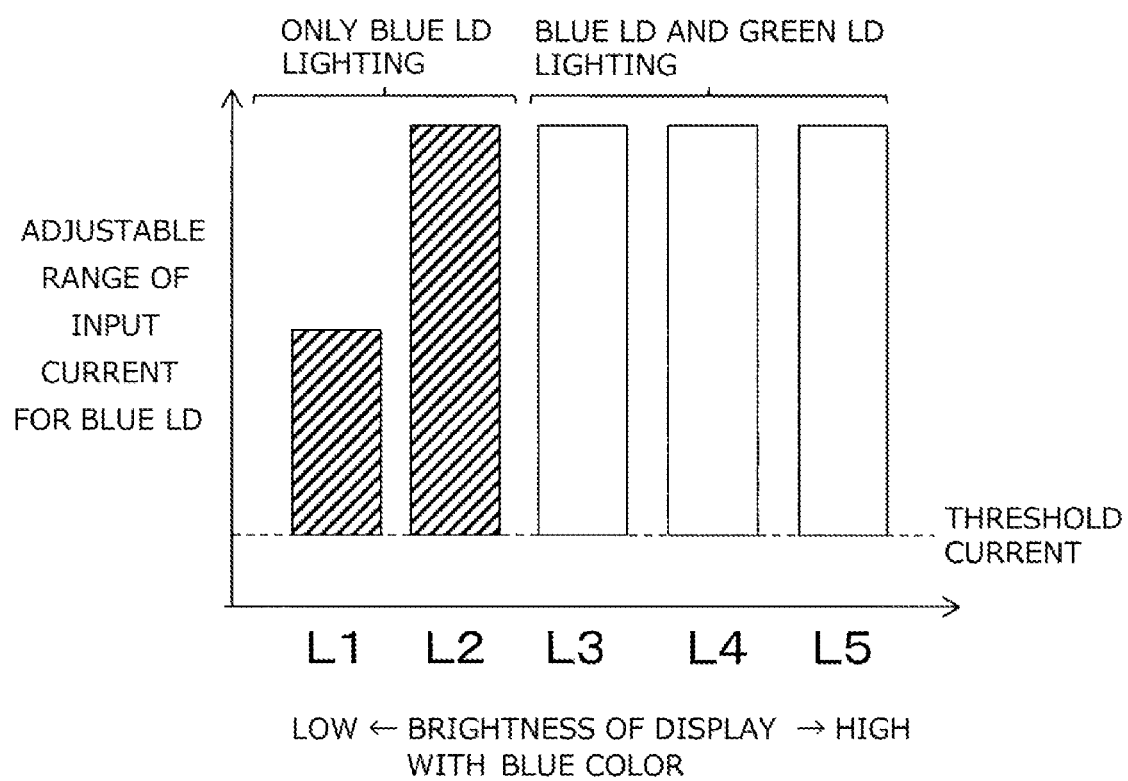
FIG. 12 is a bar chart, which shows a relationship, in the exemplary embodiment of the present disclosure, between a brightness of a displayed blue color and an adjustable range of current flowing to the blue laser diode.

FIG. 12 shows an adjustable range of current flowing to the blue LD for low-luminance display. The horizontal axis represents target luminance (L5: maximum luminance to L1: minimum luminance); the vertical axis represents an adjustable range of current flowing to the blue LD. As proposed above in the present disclosure, the image display device causes the green LD to supplementarily emit light when displaying the blue color. Therefore, the image display device can lower brightness of the displayed blue color in a range from luminance L3 to luminance L5 by decreasing the quantity of green light. Consequently, it is possible to control a light quantity without having to narrow an adjustable range of current flowing to the blue LD.

When brightness equal to or lower than luminance L2 is needed, the image display device causes the blue LD to emit light alone and controls the brightness by adjusting current flowing to the blue LD. In this way, the image display device uses blue light alone without assist of green light when providing a display at low luminance, thereby making it possible to ensure a current adjustable range even at a low luminance.

When the green light assists the blue light, the image display device may determine a mixture ratio, based on ambient temperature. When the green light assists the red light, it is possible to widen a current adjustable range for low-luminance display. It is thus desirable that a central wavelength of the red LD be in a range from 650 nm to 655 nm inclusive when a temperature adjacent to the red LD is approximately 25° C. The method for controlling light sources in the present disclosure may be combined with PWM (pulse width modulation) or high-frequency wave superimposition.

As described above, the image forming unit employs a system that scans a MEMS mirror to generate an image. However, the image forming unit may employ a field sequential system having liquid crystal on silicon (LCOS) or a two-dimensional modulation element, such as a digital mirror device (DMD). If the image forming unit employs the field sequential system, it is possible to improve the maximum luminance for the image display device.

A region within region A in FIG. 6 or the hatched region in FIG. 11 which a user can visually perceive easily may be selected in advance.

In the present disclosure, a color range is expressed using a 1931 chromaticity diagram; however, a color range may be expressed using a 1976 chromaticity diagram.

The configurations described in the foregoing exemplary embodiment are exemplary. It should be understood that in addition to the configurations described above and illustrated in the drawings, any other configurations may also be employed.

The image display device in the present disclosure can suppress a reduction in luminance of a display image at high temperature at which an output of a laser light source is limited and can adjust the luminance over a wide range even when providing a display at low luminance. The present disclosure is applicable to image display devices, each of which includes one or more laser light sources.

What is claimed is:

1. An image display device comprising:
a laser light source that emits a plurality of laser beams including a red laser beam, a green laser beam, and a blue laser beam;
a controller that controls lighting of the laser light source;
a luminance switch that switches luminance of the laser light source;
a temperature acquisition unit that obtains temperature information with respect to the laser light source; and
an image forming unit that creates an image from the plurality of laser beams emitted from the laser light source, wherein:
the controller varies a light output ratio between the plurality of laser beams, based on the temperature information obtained by the temperature acquisition unit,
the luminance switch can select from two or more modes including a low-luminance mode and a high-luminance mode,
when selecting the high-luminance mode, the luminance switch causes the laser light source to emit the red laser light and the green laser light together, and
when selecting the low-luminance mode, the luminance switch causes the laser light source to emit the red laser light alone.

2. An image display device comprising:
a laser light source that emits a plurality of laser beams including a red laser beam, a green laser beam, and a blue laser beam;
a controller that controls lighting of the laser light source;
a luminance switch that switches luminance of the laser light source;
a temperature acquisition unit that obtains temperature information with respect to the laser light source; and
an image forming unit that creates an image from the plurality of laser beams emitted from the laser light source, wherein:
when a red color is displayed, the controller varies a light output ratio between the red laser beam and the green laser beam, based on the temperature information obtained by the temperature acquisition unit,
the luminance switch can select from two or more modes including a low-luminance mode and a high-luminance mode,
when selecting the high-luminance mode, the luminance switch causes the laser light source to emit the red laser light and the green laser light together, and
when selecting the low-luminance mode, the luminance switch causes the laser light source to emit the red laser light alone.

3. An image display device comprising:
a laser light source that emits a plurality of laser beams including a red laser beam, a green laser beam, and a blue laser beam;
a controller that controls lighting of the laser light source;
a luminance switch that switches luminance of the laser light source;
a temperature acquisition unit that obtains temperature information with respect to the laser light source; and
an image forming unit that creates an image from the plurality of laser beams emitted from the laser light source, wherein:
when a blue color is displayed, the controller varies a light output ratio between the blue laser light and the green laser light, based on the temperature information obtained by the temperature acquisition unit,
the luminance switch can select from two or more modes including a low-luminance mode and a high-luminance mode,
when selecting the high-luminance mode, the luminance switch causes the laser light source to emit the blue laser light and the green laser light together, and
when selecting the low-luminance mode, the luminance switch causes the laser light source to emit the blue laser light alone.

4. The image display device according to claim 1, further comprising a luminance acquisition unit that obtains external light intensity information with respect to light external to the image display device, wherein the luminance switch selects from the two or more modes including the low-luminance mode and the high-luminance mode, based on the external light intensity information from the luminance acquisition unit.

5. The image display device according to claim 1, wherein in the low-luminance mode, the controller controls luminance by controlling an emission pulse width for the laser light source.

6. The image display device according to claim 1, wherein the red laser beam emitted from the laser light source has a central oscillation wavelength ranging from 650 nm to 655 nm inclusive at 25° C.

7. The image display device according to claim 1, wherein the image forming unit is a two-dimensional micro electro mechanical systems (MEMS) mirror.

8. The image display device according to claim 1, wherein:
the image forming unit is a two-dimensional modulation element, and
the two-dimensional modulation element is driven in accordance with a field sequential system that sequentially emits red light, blue light, and green light to create a full-color display.

9. The image display device according to claim 2, further comprising a luminance acquisition unit that obtains external light intensity information with respect to light external to the image display device,
wherein the luminance switch selects from the two or more modes including the low-luminance mode and the high-luminance mode, based on the external light intensity information from the luminance acquisition unit.

10. The image display device according to claim 2, wherein in the low-luminance mode, the controller controls luminance by controlling an emission pulse width for the laser light source.

11. The image display device according to claim 2, wherein the red laser beam emitted from the laser light source has a central oscillation wavelength ranging from 650 nm to 655 nm inclusive at 25° C.

12. The image display device according to claim 2, wherein the image forming unit is a two-dimensional micro electro mechanical systems (MEMS) mirror.

13. The image display device according to claim 2, wherein:
the image forming unit is a two-dimensional modulation element, and
the two-dimensional modulation element is driven in accordance with a field sequential system that sequentially emits red light, blue light, and green light to create a full-color display.

14. The image display device according to claim 3, wherein the red laser light emitted from the laser light source has a central oscillation wavelength ranging from 650 nm to 655 nm inclusive at 25° C.

15. The image display device according to claim 3, wherein the image forming unit is a two-dimensional micro electro mechanical systems (MEMS) mirror.

16. The image display device according to claim 3, wherein:
the image forming unit is a two-dimensional modulation element, and
the two-dimensional modulation element is driven in accordance with a field sequential system that sequentially emits red light, blue light, and green light to create a full-color display.

* * * * *